United States Patent [19]

Chen

[11] Patent Number: 5,112,410
[45] Date of Patent: May 12, 1992

[54] CADMIUM ZINC SULFIDE BY SOLUTION GROWTH

[75] Inventor: Wen S. Chen, Seattle, Wash.

[73] Assignee: The Boeing Company, Seattle, Wash.

[21] Appl. No.: 563,494

[22] Filed: Aug. 7, 1990

Related U.S. Application Data

[63] Continuation-in-part of Ser. No. 372,271, Jun. 27, 1989, abandoned.

[51] Int. Cl.$^5$ .................. H01L 31/072; H01L 31/18; H01L 31/0328
[52] U.S. Cl. .................. 136/260; 136/265; 437/5; 428/620; 427/74; 357/16; 357/30
[58] Field of Search .................. 427/74, 126.1, 126.2; 428/620; 437/4, 5, 108, 109, 233, 234; 136/260, 258 PC, 265; 357/16, 30 E, 30 J

[56] References Cited

U.S. PATENT DOCUMENTS 4,447,335  5/1984  Loeffler et al. .................. 252/1
4,523,051  6/1985  Mickelsen et al. .................. 136/260
4,611,091  9/1986  Choudary et al. .................. 136/260

OTHER PUBLICATIONS

N. C. Sharma et al., *Thin Solid Films*, vol. 60, pp. 55-59, (1979).

*Primary Examiner*—Aaron Weisstuch
*Attorney, Agent, or Firm*—Donald J. Lisa

[57] ABSTRACT

A process for depositing thin layers of a II-VI compound cadmium zinc sulfide (CdZnS) by an aqueous solution growth technique with quality suitable for high efficiency photovoltaic or other devices which can benefit from the band edge shift resulting from the inclusion of Zn in the sulfide. A first solution comprising $CdCl_2 2.5H_2O$, $NH_4Cl$, $NH_4OH$ and $ZnCl_2$, and a second solution comprising thiourea $((NH_2)_2CS)$ are combined and placed in a deposition cell, along with a substrate to form a thin i.e. 10 nm film of CdZnS on the substrate. This process can be sequentially repeated with to achieve deposition of independent multiple layers having different Zn concentrations.

18 Claims, 2 Drawing Sheets

CADMIUM ZINC SULFIDE BY SOLUTION GROWTH

The Government of the United States of America has rights in this invention pursuant to Contract No. ZL-8-06031-8 awarded by the U.S. Department of Energy.

RELATED APPLICATION

This application is a continuation-in-part of my application Ser. No. 07/372,271 filed on Jun. 27, 1989, now abandoned and is related to application Ser. No. 07/569,411 filed Aug. 17, 1990.

BACKGROUND OF THE INVENTION

The present invention pertains to a process for depositing a thin film of a II-VI compound cadmium zinc sulfide (CdZnS) by an aqueous solution growth technique. The film has a quality suitable for high efficiency heterojunction photovoltaic or other photoelectric devices which may benefit from the band edge shift Heterojunction photovoltaic devices are cells wherein a junction is defined at an interface between two different semiconductor materials, one of which is n-type material such as CdS or CdZnS and the other of which is p-type material such as $CuInSe_2$, or CuInGaSe$_2$. One example of such prior art devices is disclosed in Mickelsen et al. U.S. Pat. No. 4,523,051 reissued as Re. 31,968.

One effective means of improving the efficiency rating of a heterojunction photovoltaic cell is to use layers of a II-VI, semiconductor such as CdS or the mixed CdZnS as the n-type layer in copper indium diselenide ($CuInSe_2$)/CdZnS and copper indium gallium diselenide ($CuInGaSe_2$)/CdZnS heterojunction devices. Since the n-type CdS or CdZnS is used as the window layer of the solar cell, the transparency of the CdS or CdZnS layers is critical over the full range from the band edge of the absorber on the long wavelength end (1.3 microns) to the cutoff of the solar spectrum on the short wavelength end (0.3 microns).

When used in heterojunction photovoltaic devices, the sulfide layers have been deposited in thicknesses of approximately 3 microns and show essentially complete absorption below a wavelength of approximately 500 nm, depending on the Zn content of the sulfide.

It has been shown that by increasing the Zn content in the CdZnS from 0% for CdS to 20% for $Cd_{0.8}Zn_{0.2}S$ the band edge of this material is shifted to higher energies, extrinsic near-band-edge absorption is reduced and the open circuit voltage and resulting efficiency of $CuInSe_2$/CdZnS and $CuInGaSe_2$/CdZnS devices is increased.

It has also been shown that by decreasing the thickness of the sulfide layer below a critical value in the range of 50 nm, an increase in radiation transmission through the sulfide and therefore an increase in the energy conversion efficiency in the $CuInSe_2$/CdZnS and $CuInGaSe_2$/CdZnS devices is obtained. The decreased thickness of the sulfide layer reduces the absorption of incoming light in the sulfide layer through which the light must pass before reaching the active junction area. However, it has proved difficult to obtain a CdZnS layer that is sufficiently transparent to allow all of the radiation transmission through the sulfide. In the past, formation of CdZnS layers has been by use of physical vapor deposition from the compounds in a vacuum. Vapor deposition has resulted in layers which are too thick to provide maximum energy conversion efficiency in heterojunction devices.

The Choudary et al. U.S. Pat. No. 4,611,091, discloses a similar cell where deposition of CdS by a solution growth technique has been proposed but apparently never used. Chemical deposition of CdS films has been described in the article, "Some Properties of Thin Films of Chemically Deposited Cadmium Sulphide" by Danaher et al. in Solar Energy Materials Vol. 12 (1985), pp. 137–148, and of $Cd_{(1-x)}Z_xS$ in the article, "Electroless Deposition of Semiconductor Films" by Sharma et al, *Thin Solid Films, Vol.* 60 (1979), pp. 55–49. However, solution growth of sulfide layers suitable for specialized photovoltaic devices has not been described and there is no indication that such solution growth procedures would be applicable to forming a CdZnS film that is sufficiently thin to pass a substantial portion of the radiation having a wavelength of 400 nm and yet be sufficiently continuous to avoid contact between the layers on opposite sides of the CdZnS film.

SUMMARY OF THE INVENTION

The present invention relates to providing an improved method and product formed by the method for producing a CdZnS layer formed by an aqueous solution growth technique and a layer having unique properties not attained by the prior art vapor deposition procedures.

An improved process according to one feature of the present invention allows deposition of a plurality of CdZnS layers each having a different Zn content that is selected to optimize performance of a heterojunction photovoltaic device.

Another feature of the present invention to provide a new and improved process for chemically depositing a thin CdZnS film having a thickness of about 20 nm on a heterojunction photovoltaic device to provide a high (>70%) transmission through the CdZnS layer of radiation having a wavelength of 400 nm.

It is yet a further feature to provide a novel process and product formed by the process which involves preparing a very large quantity of a first solution comprising $CdCl_2 \cdot 2.5H_2O$, $NH_4Cl$, $NH_4OH$ and $ZnCl_2$, and a very large quantity of a second solution comprising thiourea (($NH_2$)$_2$CS). Thereafter, ammonium hydroxide ($NH_4OH$) is added to a beaker containing a small amount of the first solution and allowed to stand at ambient conditions for a period of about at least half an hour but not more than about an hour. The contents of the beaker are then mixed with the second solution in a deposition tank. A substrate having a I-III-VI$_2$ material such as a $CuInGaSe_2$ layer is immersed in the deposition tank to form the thin CdZnS film on the $CuInGaSe_2$ during the time required for completion of the reaction. The deposition tank is placed in a heated water bath to maintain the constant temperature and the mixed solution is constantly agitated during deposition until the reaction is completed which in the described embodiment requires about 30 minutes. A thin film composed of multiple layers having different Zn contents can be obtained by varying the ratio of $CdCl_2$ to $ZnCl_2$ in sequentially applied layers. The layer compositions are thus independent and the total film thickness is the sum of the single layer thicknesses. Layer thickness can be reduced by reducing the amount of $CdCl_2$ and $ZnCl_2$ in the starting solutions.

These and other features and advantages of the present invention will become apparent to those skilled in

DETAILED DESCRIPTION OF PREFERRED EMBODIMENTS

Figure 1:
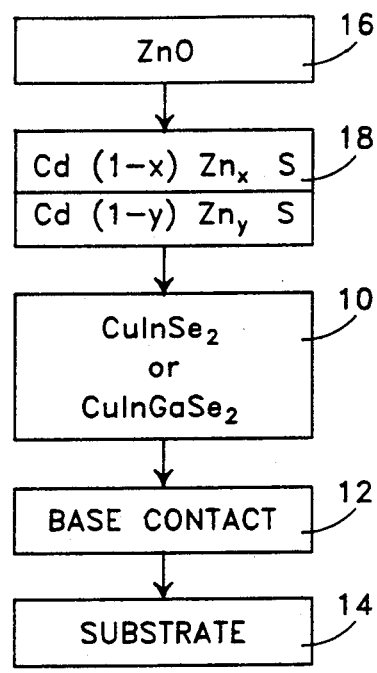
FIG. 1 is a diagrammatic view of a photovoltaic cell formed in accordance with the present invention.

The present invention will be described in connection with a p-type I-III-VI$_2$ material 10 such as CuInSe$_2$ or CuIn$_{(1-x)}$Ga$_x$Se$_2$ that is layered on a base contact 12 of molybdenum that is coated on an alumina substrate 14 in a known manner as illustrated in FIG. 1. The fundamental electrical characteristics of such I-III-VI$_2$ films used in high efficiency photovoltaic cells are not directly known. Good electrical and optical constants for these films are difficult to obtain on a repeatable basis.

From optical transmission and electrical conductivity considerations, ZnO is the best material for window layer 16 and lateral current collector available for CuInGaSe$_2$ based cells. However, since ZnO alone does not form a heterojunction with CuInGaSe$_2$, the structures ZnO/CdZnS/CuInSe$_2$ and ZnO/CdZnS/CuInGaSe$_2$ form the best compromise.

Figure 2:
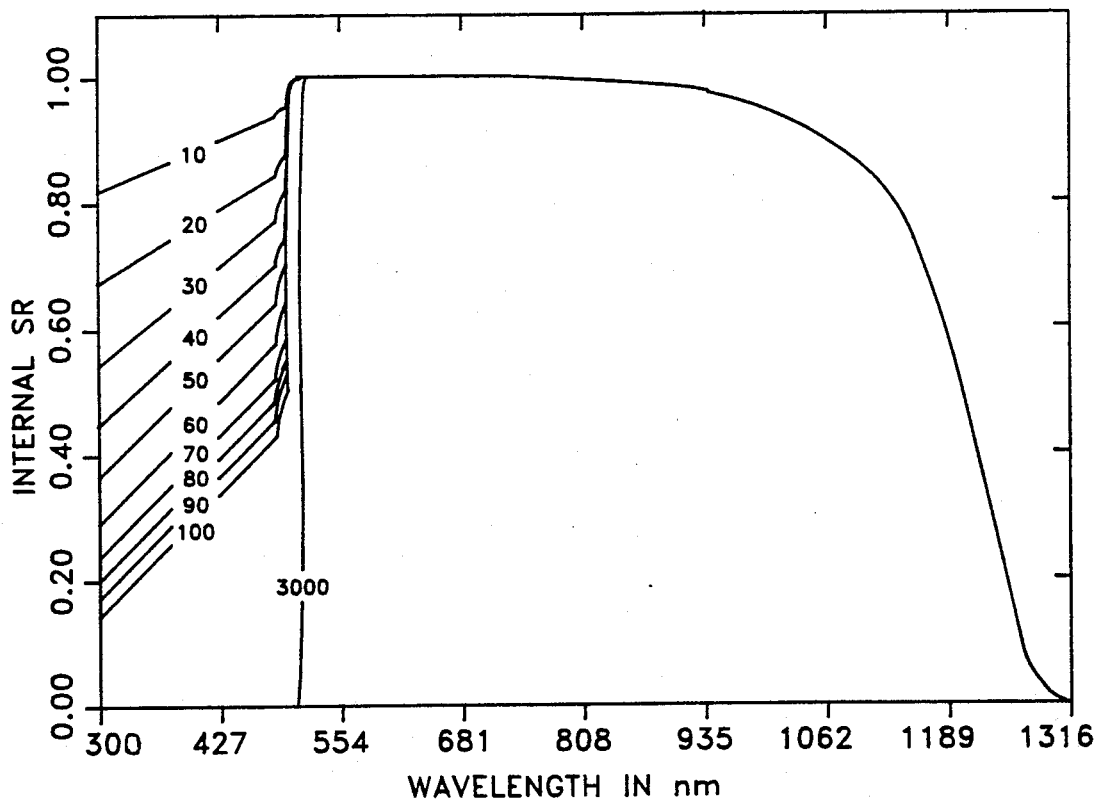
FIG. 2 is a graph showing the transmission of radiation through the CdZnS layer and the effect of layer thicknesses varying from 10 nm to 100 nm, and of 3,000 nm at wavelengths in the vicinity of 400 nm.

In such a design the CdZnS layer 18 constitutes the n-type layer of the heterojunction with the ZnO functioning along with the grid as a lateral current collector. The basic requirement for a high (>70%) optical transmission through a CdZnS layer at a wavelength of 400 nm is a thickness of between about 10 and 20 nm as illustrated in FIG. 2. This FIG. illustrates the effect of sulfide thickness on blue response of the cell. Sulfide thickness is in nm. Effect of ZnO is not included.

Physical vapor deposition in a vacuum as described in Choudary et al. U.S. Pat. No. 4,611,091 does not produce a CdZnS layer and cannot produce layers that have the desired optical properties with reasonable continuous coverage on presently available CuInGaSe$_2$ films to give the desired electrical properties. According to the present invention, the thin CdZnS layer is deposited by an aqueous solution growth technique which involves modification of a process described in the above-identified article by Danaher et al.

Figure 3:
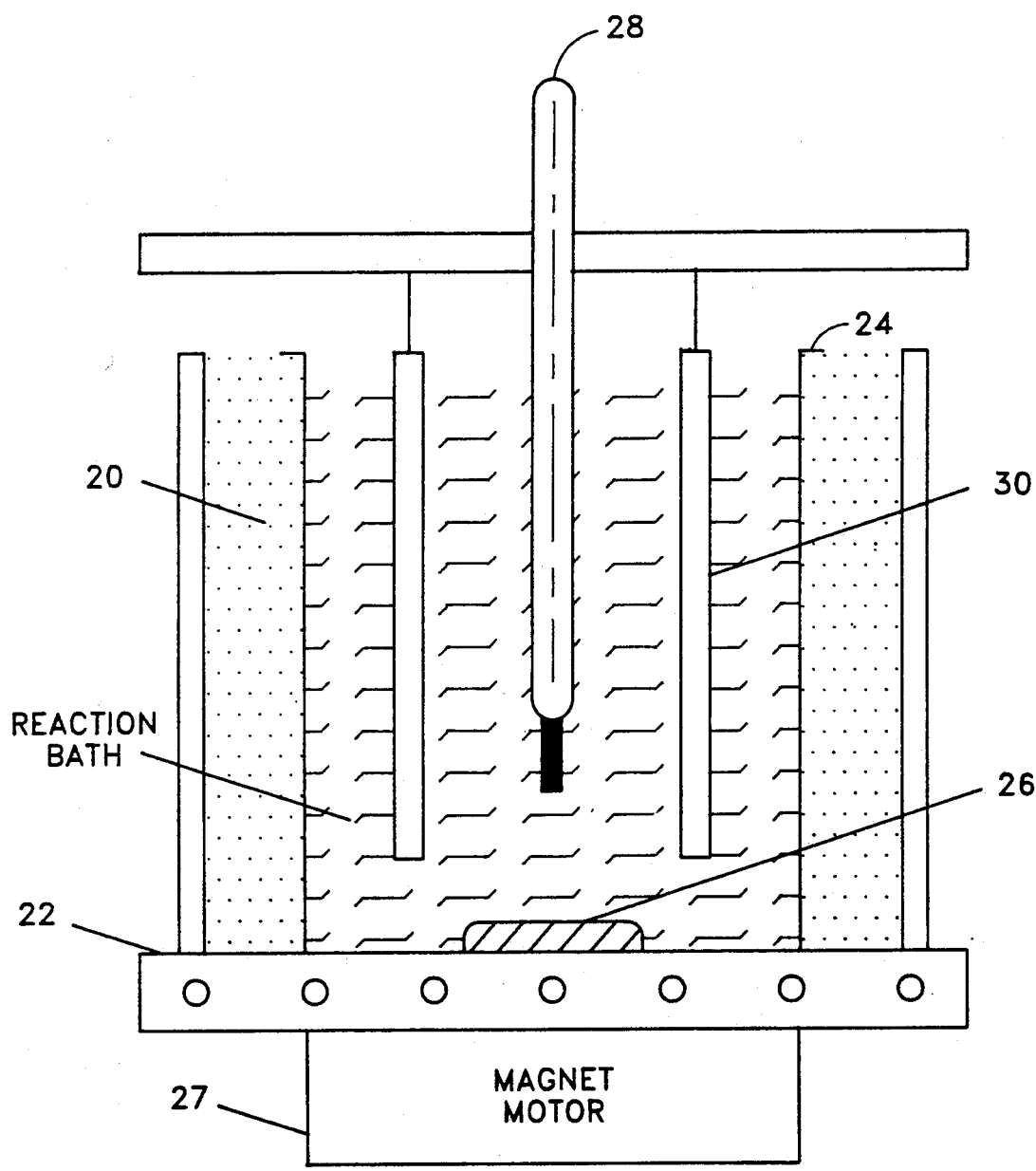
FIG. 3 is a schematic drawing of an apparatus used to implement the aqueous solution growth of CdZnS in accordance with the present invention.

In carrying out the aqueous solution growth technique, a water bath 20 having automatic temperature control supplied by heater 22 is shown in FIG. 3. A beaker 24 having two solutions combined in it is placed in water bath 20 to maintain the reaction bath temperature constant. The combined solutions in beaker 24 are vigorously and constantly stirred during the reaction and deposition procedure as by magnetic stirring unit 26. Magnet motor 27 supplies the power to operate magnetic stirring unit 27. While a magnetic stirring unit is typically the most common and effective means of stirring a solution during a aqueous solution growth deposition process, other alternatives may be used. A contact thermometer 28 which monitors the temperature of the reaction bath in beaker 24 as a constant solution temperature is preferred to ensure a constant rate of deposition. Nominally, the temperature is held constant at 85° C. but a range of 75°–95° C. is permissible. Higher temperatures allow for a faster reaction rate but it has been experimentally shown that at temperatures higher than about 85° C., the film quality measurably degrades. At excessively high temperatures, the sulfide film produced is powdery instead of a smooth continuous layer and may be insufficiently adherent with the substrate.

Substrate 30 is the material on which deposition of a CdZnS film will occur. Substrate 30 can be comprised of any material on which it is desirable to deposit a thin film of CdZnS. Glass is commonly used as substrate 30 when testing of the deposited film is performed, although the process is intended for use in various photoelectric devices, and will be described in conjunction with the photovoltaic cell of FIG. 1.

An exemplary procedure to achieve a CdZnS film of 40-50 nm is as follows:

A first solution comprising 0.0084M CdCl$_2$·2.5H$_2$O, 0.026M NH$_4$Cl, 0.26M NH$_4$OH and 0.0016M ZnCl$_2$, and an equal volume of a second solution comprising 0.0834M thiourea are prepared and combined in beaker 24 of FIG. 1 and placed in water bath 20 where the temperature is maintained at 85° C.

The thiourea in the second solution provides a source of elemental sulfur ions which are easily separated during the deposition process. The ammonia in the first solution is used as a complexing agent which redissolves unwanted precipitates comprising Cd. Additionally, while metal chlorides have been found to provide efficient solution deposited films, other salts such as CdSO$_4$, Cd(NO$_3$)$_2$, etc. may also be used. The combined solution in beaker 24 is constantly stirred by magnetic stirring unit 26 during a deposition time which is typically 30 minutes in duration. The deposition unit of FIG. 3 can be sealed during the deposition process but sealing is not a requirement since beaker 24 will not normally be filled to capacity causing an overflow condition.

The preferred molar concentrations provided above have been found to provide high quality films in a thickness range between 40 and 50 nm. However, this concentration can be altered proportionately for varying results. If lower concentrations of the metal chlorides are used, thinner films, as low as 10 nm can be achieved during the 30 minute reaction process. Higher concentrations have been shown to provide a degradation in film quality and thicker layers that do not provide the desired optical transparency that is desired for certain applications such as in photovoltaic devices.

Although molar contents of the two solutions are given above, actual measured units of each component for a particular application employing 400 ml of total solution are as follows. The first solution comprised 0.384 g. CdCl$_2$·2.5H$_2$O, 0.278 g. NH$_4$Cl, 3.47 ml. NH$_4$OH (15M), and 200 ml. H$_2$O. The amount of ZnCl$_2$ in the first solution will depend on the Zn content to be achieved. The second solution will typically comprise 1.269 g thiourea and 200 ml. H$_2$O.

Equal volumes of the two solutions may be used to provide the solution growth described herein. Thus, for the above described example, a total solution volume of about 400 ml would provide a film 40–50 nm thick in 30 minutes. The 30 minute duration represents the approximate total amount of usable reaction time for the two solutions at a controlled temperature of 85° C. irrespective of the exact Cd and Zn content.

It should be evident to those skilled in the art that the described deposition technique may be implemented by continuously conveying the substrate within a tank and make-up solutions may be added on a continuous basis to maintain the supply of Cd, Zn and S at their desired concentrations.

To determine the Zn content in the $Cd_{1-x}Zn_xS_2$ film, x can be established by the equation $x = [Zn]/([Zn]+[Cd])$. Thus, for example, for $x=0.2$ and the values given above:

$$0.2 = [Zn]/([Zn] + 0.0084M)$$

or $$Zn = 0.0021M$$

Using this formula, different zinc concentrations can be achieved for different layers of the ZnS film.

Film thickness can be varied by a dilution of the active ingredients of both solutions while maintaining the relative proportions of each solution. When deposition time and temperature are maintained constant as indicated above, thinner films that are continuous and essentially free of pin holes will be attained by more dilute solutions.

The process described above can also be applied to the aqueous deposition of double layers of different Zn contents using a sequential deposition from two different solutions. The layer compositions are then independent of each other and the total film thickness is the sum of the single layer thicknesses. A multilayer deposition is accomplished by repeating the aforementioned steps with a different value of x for zinc each time.

To remove insufficiently adhered material from substrate 30 after deposition of the CdZnS layer or layers is completed, the substrate may be agitated while immersed in beaker 24 or the beaker placed on a shaking device. Substrate 30 is then removed from the mixed solution, washed with distilled water, blown dry and baked for five minutes in an oxygen ambient at approximately 225° C. to remove absorbed moisture. The substrate now possesses a thin film of CdZnS having a thickness ranging between about 10 and 50 nm that is especially suitable for high efficiency heterojunction photovoltaic devices. Other devices which may benefit from the band edge shift resulting from Zn inclusion in the sulfide are electroluminescent and phosphor based devices.

When a p-n heterojunction photovoltaic device as described in Wen S. Chen et al. application Ser. No. 07/372,290 filed on Jun. 27, 1989 is manufactured by adding a dual ZnO layer on the CdZnS film, the solution growth CdZnS film must be removed from the non-functioning surfaces of the device. This is performed by placing a photoresist on the active surface and etching away the unwanted deposited CdZnS film that is not protected by photoresist. The type of mask used in conjunction with the present invention will depend on the desired device to be manufactured.

The drawing illustrates a substrate 30 suspended vertically to undergo the deposition process. This technique is efficient for substrates in the range of $2\frac{1}{2}'' \times 2\frac{1}{2}''$. However, for larger semiconductors, horizontal suspension can be used more effectively. By using horizontal suspension in the solution, large area deposition is possible which, in turn, contributes to a cost efficient large scale production.

What has been provided, therefore, is a process and the product produced by the process for depositing thin layers of a II-VI compound CdZnS by an aqueous solution growth technique which provides quality suitable for high efficiency heterojunction photovoltaic devices. A continuous film layer essentially free of pin holes and having a thickness under 50 nm and a Zn content of 20% is achievable inexpensively and efficiently by the process described.

While specific embodiments of this invention have been described, further modifications and changes may be made which do not depart from the spirit of the invention. It is intended that such modifications, equivalents and changes which fall within the scope of the claims be covered thereby.

I claim:

1. A method of depositing a non-powdery, continuous thin film layer that is essentially free of pin holes of a mixed II-VI compound CdZnS on a substrate comprised of a I-III-VI$_2$ material by immersion of the substrate into a tank having an aqueous solution containing Cd, Zn and S at a temperature and for a time sufficient to provide said continuous thin film layer with a thickness sufficiently thin to provide transmission of at least 70% of radiation having a wavelength of 400 nm.

2. A method as recited in claim 1, wherein the content of Cd and the content of Zn in said CdZnS layer is approximately represented by the expression $Cd_{0.8}Zn_{0.2}S$ and the layer thickness is less than about 50 nm.

3. A method as recited in claim 1, wherein the aqueous solution is prepared by:
   providing a first solution comprising 0.0084M CdCl$_2$·2.5H$_2$O, 0.026M NH$_4$Cl, 0.26M NH$_4$OH, and, 0.0016M ZnCl$_2$;
   providing an equal volume of a second solution comprising 0.0834M (NH$_2$)$_2$CS; combining in a deposition tank said first solution and said second solution to form a combined solution;
   positioning said deposition tank in a water bath which is maintained at about 85° C.; and
   while the substrate is immersed in said tank, stirring the combined solution with sufficient intensity to provide a non-powdery coating that is adherent to an exposed surface of said substrate.

4. A method as recited in claim 3, wherein said substrate is immersed for a period of about 30 minutes.

5. The product of the method of claim 3.

6. The product of the method of claim 1.

7. A method of depositing on a substrate comprised of a I-III-VI$_2$ material by sequential procedures a first thin layer of CdZnS material having a first zinc content and second thin layer of CdZnS having a second zinc content that is different than the first zinc content, the combined thickness of the two layers being less than about 50 nm and effective to provide transmission of at least 70% of solar radiation having a wavelength of 400 nm, each of the procedures including the steps of:
   providing two solutions, one solution continuing both Cd and Zn and the other solution containing S;
   immersing said substrate into a tank containing said first and second solutions while the solutions are vigorously stirred and the temperature is controlled so as to obtain a non-powdery, smooth, continuous film surface that is adhered to the substrate; and
   removing the substrate from said tank nd thereafter removing absorbed moisture from the thin film to provide on said substrate surface a thin layer that is free of pinholes.

8. The product formed by the method of claim 7.

9. A process of forming on a substrate surface a thin continuous film of $Cd_{(1-x)}Zn_xS$ essentially free of pin holes by supplying two solutions into a tank, the first solution containing $CdCl_2$ and $ZnCl_2$ together with $NH_4Cl$ and $NH_4OH$;

the second solution containing sulfur;

immersing said substrate into a tank containing said first and second solutions while the solutions are vigorously stirred and the temperature is controlled so as to obtain a non-powdery, smooth, continuous film that is adhered to the substrate, and provides at least 70% transmission of radiation having a wavelength of 400 nm by limiting the $CdCl_2$ and $ZnCl_2$ content in the first solution so that the film thickness is less than about 50 nm.

10. The process as defined in claim 9, wherein the immersion step occurs for a period of time required for the reaction of the solutions in the tank to go to completion.

11. The process as defined in claim 10, wherein the time is about 30 minutes and the solution temperature is maintained at about 85° C.

12. The process as defined in claim 9, wherein the thin film is formed of at least two layers of $Cd_{(1-x)}Zn_xS$ wherein the Zn content x is between about 0.1 and 0.3 and is made different for each layer by varying the ratio of $CdCl_2$ and $ZnCl_2$ in the first solution.

13. The process as defined in claim 12, wherein the thickness of each layer is controlled by varying the combined $CdCl_2$ and $ZnCl_2$ content in the first solution.

14. The process as defined in claim 9, wherein the thin film is formed of at least two layers of $Cd_{(1-x)}Zn_{(x)}S$ and the thickness of each layer is controlled by varying the combined $CdCl_2$ and $ZnCl_2$ content in the first solution.

15. A photoelectric cell comprising a thin film of CdZnS that forms a continuous coating free of pin holes and has a thickness that is sufficiently thin to provide at least 70% transmission of radiation having a wavelength 400 nm.

16. A cell as defined in claim 15, wherein said thin film is an n-type layer formed on a p-type layer of a I-III-VI$_2$ material.

17. A cell as defined in claim 16, wherein the p-type layer material is a $CuInGaS_2$ and the thickness of the thin film is less than about 20 nm.

18. A cell as defined in claim 15, wherein said thin film is an n-type layer that forms a heterojunction with an underlying p-type layer of I-III-VI$_2$ material and is covered by a ZnO layer.

* * * * *